United States Patent [19]

Sellari, Jr. et al.

[11] 3,743,950

[45] July 3, 1973

[54] THRESHOLD DETECTOR FOR A VOICE FREQUENCY RECEIVER

[75] Inventors: Daniele Sellari, Jr.; Horace K. Frost, both of Corinth, Miss.

[73] Assignee: International Telephone and Telegraph Corporation, New York, N.Y.

[22] Filed: Mar. 3, 1972

[21] Appl. No.: 231,556

[52] U.S. Cl. .............. 328/151, 179/1 VC, 307/235, 328/146

[51] Int. Cl. .............................................. H03k 5/20

[58] Field of Search ............................ 307/230, 235; 328/146, 151; 179/1 VC

[56] References Cited

UNITED STATES PATENTS

| | | | |
|---|---|---|---|
| 3,686,577 | 8/1972 | Fruhauf | 328/151 |
| 3,119,984 | 1/1964 | Brandt et al. | 328/151 X |

*Primary Examiner*—John Zazworsky
*Attorney*— C. Cornell Remsen. Jr.. Delbert P. Warner et al.

[57] ABSTRACT

A threshold detector is disclosed which provides an output signal in response to a sinusoidal signal from a band pass filter while the sinusoidal signal has a voltage level equal to or above a reference voltage. The detector employs an operational amplifier as a first comparator or detector circuit to provide a pulse in response to each excursion of the sinusoidal signal above the threshold value. Current from the pulse is used to charge a capacitor in an RC circuit to a level above the reference voltage. A second operational amplifier is connected to the RC circuit to provide the desired constant output voltage so long as the stored voltage is equal to or above the reference voltage. Feedback from the output of the second operational amplifier to the input of the first operational amplifier is used to adjust the reference voltage to a level which makes the threshold detector insensitive to noise input associated with the sinusoidal signal.

13 Claims, 18 Drawing Figures

THRESHOLD DETECTOR FOR A VOICE FREQUENCY RECEIVER

CROSS-REFERENCE TO RELATED APPLICATIONS

The present invention relates to inventions disclosed in two earlier filed patent applications of Daniele Sellari. Each of those applications was filed on Dec. 23, 1970 and assigned to the same assignee as the present application. One is identified as application Ser. No. 100,950, entitled "Multi-Frequency Receiver" and the other is Ser. No. 100,951, entitled "Limiter For Multi-Frequency Voice Receiver."

BACKGROUND OF THE INVENTION

1. Field of the Invention

The present invention relates to a threshold detector for voice frequency signals. It particularly relates to a threshold detector which provides a steady state output signal in response to a sinusoidal input signal when peak values of the input signal equal or exceed a given reference voltage level. The threshold detector has particular utility when used in the output circuit of a filter.

2. Description of the Prior Art

The closest known prior art is shown and discussed in U.S. Pat. application No. 100,950, referred to previously. Application No. 100,951 discloses related subject matter.

In the prior art, band pass filters are used in telephone signal receivers for isolating a particular sinusoidal signal used in multi-frequency signaling. The signals transmitted by the band pass filters are then supplied to threshold detectors which provide output signals when the sinusoidal signals exceed certain threshold levels. The output signals are transmitted to memory and decoder units to provide indications of calling digits.

The prior art devices have required the use of elaborate circuits to provide the desired threshold detection and to provide appropriate signals to memory circuits. The memory circuits in turn have provided signals to decoders from which the desired decoded output signals are determined.

SUMMARY OF THE INVENTION

In view of the foregoing, it is an object of the present invention to provide an improved threshold detector for use in multi-frequency signal detectors. It is a further object to provide a threshold detector circuit for operation with a bandpass filter where the threshold detector combines the characteristics of a high input impedance with an accurate and stable response at a particular threshold voltage level to provide for the transmission of a constant output voltage. A further object is to provide a threshold detector which is immune to variations in the input signal due to noise.

A threshold detector in accordance with the present invention employs a first operational amplifier having a high input impedance to receive sinusoidal signals from a band pass filter. The operational amplifier receives also a reference voltage and provides an output pulse when the sinusoidal signals exceed the reference voltage level. The output pulse is applied to an RC circuit which stores a voltage proportional to the pulse and sustains a voltage between pulses, i.e., between peaks of the sinusoidal voltage. While this stored voltage remains above a certain minimum level it provides a voltage to maintain a second operational amplifier in a conductive state. The second operational amplifier supplies a constant output representing a code value corresponding to the sinusoidal signals. In order to adjust the reference voltage to the first operational amplifier to a level which would make it insensitive to sinusoidal variations due to noise content, feedback is provided from the output of the second amplifier to modify the reference voltage.

BRIEF DESCRIPTION OF THE DRAWINGS

The above mentioned and other features and objects of this invention and the manner of obtaining them will become more apparent, and the invention itself will be best understood by reference to the following description of an embodiment of the invention taken in conjunction with the accompanying drawings, in which.

DESCRIPTION OF PREFERRED EMBODIMENTS

Figure 1:
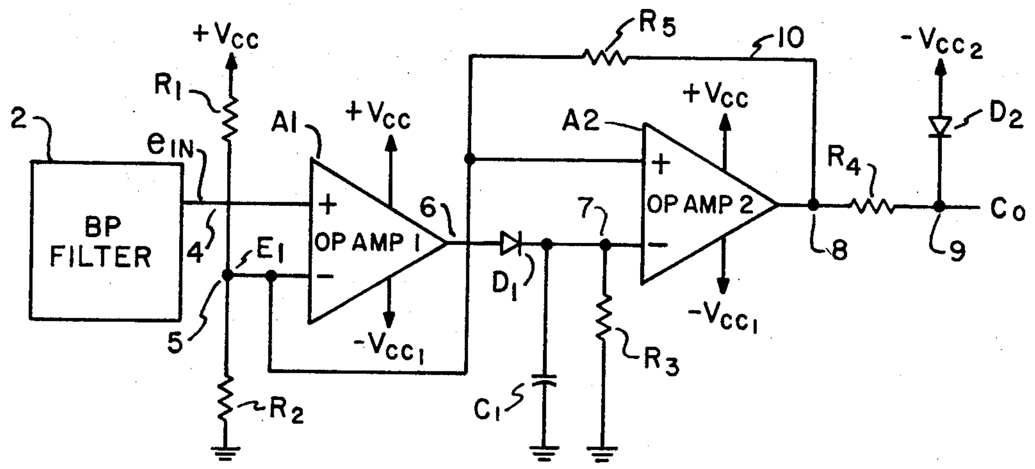
FIG. 1 is a schematic drawing showing an arrangement of circuits for a preferred embodiment of the invention.

In FIG. 1, a suitable input (in the form of a sinusoidal wave) from bandpass filter 2 is applied over line 4 to the threshold detector, which forms the balance of the figure to the right of line 4. The signal applied over line 4 is a sinusoidal signal corresponding to one of the multi-frequency tones used in place of dial pulses in many modern telephone sets and switching systems. The threshold detector compares the incoming voice frequency signal with a reference voltage E1 (at 5) and supplies an output signal when the sinusoidal signal equals or exceeds E1.

Due to the characteristics of the operational amplifier A1, the voltage level required to initiate A1 is equal to the Reference Voltage within a few millivolts. For this reason, the voltage required to initiate A1 will be referred to herein as the Reference Voltage. Furthermore, the term "sufficient $e_{in}$" means an $e_{in}$ voltage level equal to or exceeding the Reference Voltage.

When the peak value of the sinusoidal input voltage $e_{in}$ equals or exceeds a reference voltage level E1 established by +Vcc across the voltage divider formed by resistors R1 and R2, the operational amplifier A1 will provide an output to line 6. The output at 6 will charge the capacitor C1 in a positive voltage direction through the diode D1. Thereafter, a charge will be applied to the capacitor C1 each time the sinusoidal input voltage reaches a sufficiently high peak value.

The R3C1 time constant is chosen to prevent C1 from discharging below a critical level during the $e_{in}$ negative half-cycles. Each sufficient $e_{in}$ positive half-cycle charges C1 enough to cause an operational amplifier A2 to provide an output. Part of the output at 8 of operational amplifier A2 is fed back through line 10 over resistor R5 to operational amplifier A1. This feedback signal E2 lowers the voltage available E1 at terminal 5, which constitutes the reference voltage (E1 – E2) and thereby establishes a lower level at which the sinusoidal input voltage will operate the operational amplifier A1. This feedback helps to prevent erratic threshold detector output ($e_{out}$) at 8 when noise appears mixed with the sinusoidal input voltage at 4.

Operational amplifier A2 provides a negative going output voltage at 8. The diode D2 clamps the output of A2 at a desired negative voltage level based on the voltage −Vcc2.

The operational amplifier A1 presents a high impedance (typically 1 megohm) to the sinusoidal input signal. This high input impedance is desirable to prevent loading of the preceding circuitry, represented by block 2, which supplies $e_{in}$. This high input is particularly desirable when $e_{in}$ is sourced by an active filter.

Figure 2:
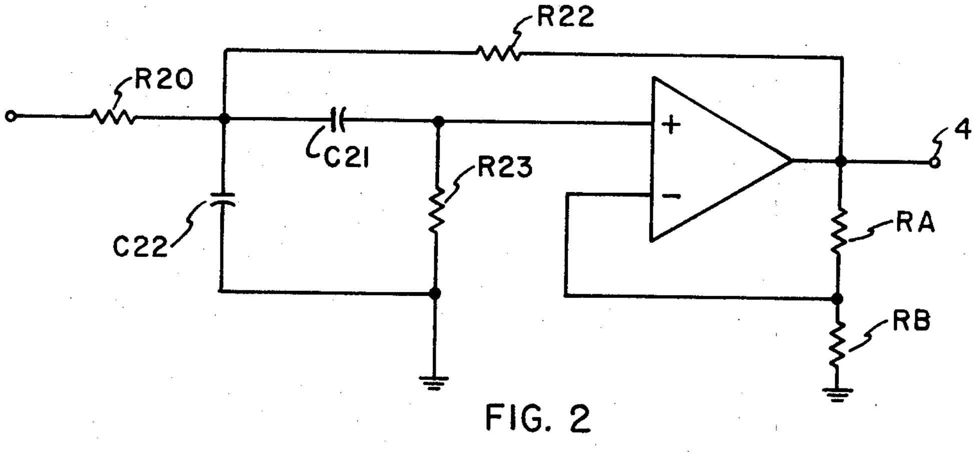
FIG. 2 shows the general configuration of a band pass filter corresponding to block 2 of FIG. 1.

It is desirable that the voltage level required to operate the operational amplifier A1 be very accurate and be maintained without change. This voltage level defines the effective bandwidth of a filter 2 which is the source of the sinusoidal voltage $e_{in}$. A configuration of an exemplary bandpass (BP) filter is indicated in FIG. 2. The characteristics and the effective bandwidth (BW) variations with different reference voltages are shown in FIG. 3.

The bandpass filter represented in FIG. 2 is a second order bandpass filter driven by a square wave. It passes the fundamental of the square wave, providing a sinusoidal output voltage. This output voltage is then applied as the sinusoidal input voltage $e_{in}$ which activates a voltage level sensor. In the present example the voltage level sensor is the threshold detector of FIG. 1. The gain of the amplifier in FIG. 2 is determined by feedback resistors R20 and R22 in accordance with the relation $R22 = (k-1)R20$. Exact equations, beyond the scope of this disclosure, have been employed in the analysis of the filter.

Figure 3:
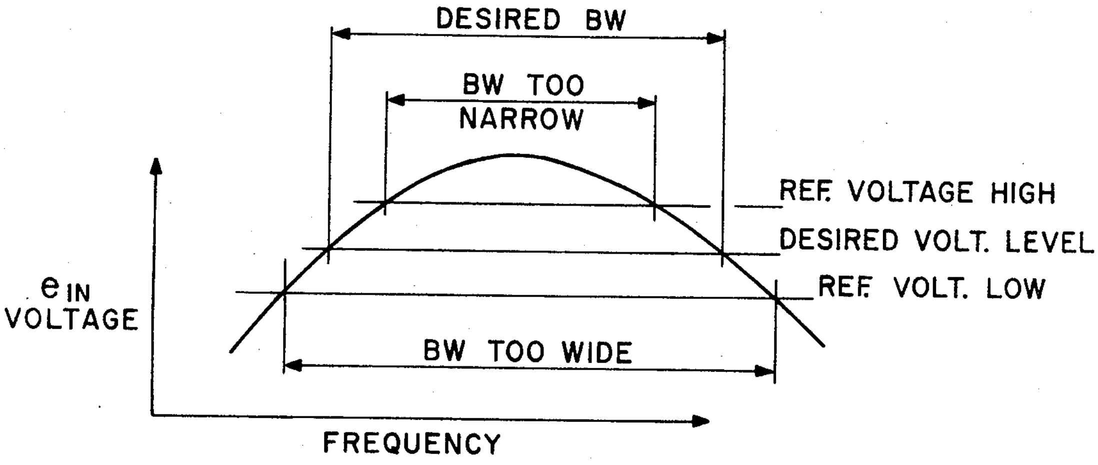
FIG. 3 shows various frequency response characteristics of an exemplary band pass filter and the way it depends on the voltage threshold level to an operational amplifier which is coupled to the output terminal of the filter.

It is shown in FIG. 3 that a variation in Reference Voltage will cause a change in the effective bandwidth BW of the source filter. Should the effective BW become too narrow, A1 would not be initiated on certain frequencies which are necessary for proper operation of such systems as tone telemetry receivers and V.F. Receivers. Furthermore, if the BW should become too wide A1 would initiate on frequencies which would adversely affect characteristics such as music and speech immunity. The desire for proper BW in the aforementioned systems has been pointed out in technical papers relating to push-button telephone systems.

The accuracy and stability of the Reference Voltage is assured by employing a fixed +Vcc, by using low tolerance metal film resistors in the divider (R1, R2) and a high gain operational amplifier.

Figure 4B:
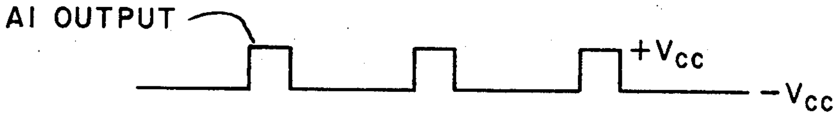
FIG. 4B depicts the output of the first operational amplifier in response to the inputs of FIG. 4A, FIGS. 5A – 5C show additional voltage relationships involved in a preferred embodiment of the invention.
Figure 4A:
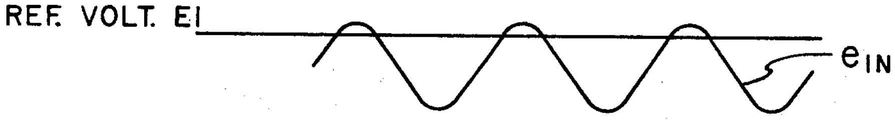
FIG. 4A shows the sinusoidal input $e_{in}$ relative to the reference voltage E1.

The operational amplifier A1 output changes from −Vcc1 to +Vcc on each sufficient $e_{in}$ half cycle as indicated in FIGS. 4A and 4B. Each leading edge of the A1 output is shown as a step function, however, this output is used to charge C1 and thus a very slight charge curve appears on the leading edge.

At initial conditions C1 is discharged to ground thru R3. When the voltage level at point 6 changes from −Vcc1 to +Vcc, C1 is charged toward +Vcc thru D1. When the voltage on C1 equals or exceeds the Reference Voltage, operational amplifier A2 provides an output at point 8.

Figure 5A:
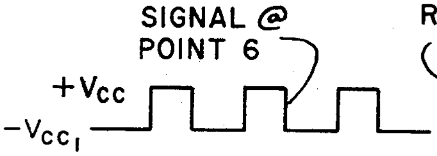
Figure 5B:
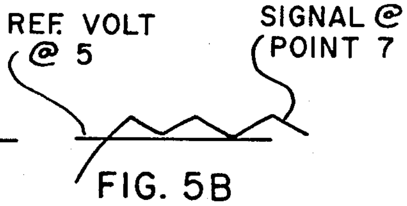
Figure 5C:
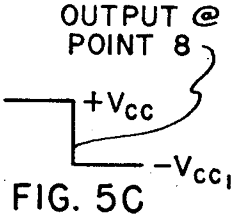

Since the input voltage to A2 over 6 and 7 would otherwise appear as a series of positive going pulses (half cycles of $e_{in}$), the R3C1 time constant is selected to prevent C1 from discharging to a voltage less than the Reference Voltage during inter-pulse periods. Diagrams indicating these relationships are shown in FIGS. 5A – 5C.

Figure 6A:
FIGS. 6A – 6E show the effect of noise on the input and output signals of an embodiment of the threshold detector.
Figure 6B:
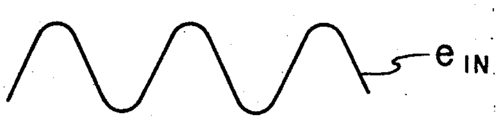
Figure 6C:
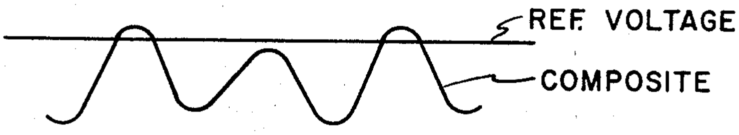
Figure 6D:
Figure 6E:
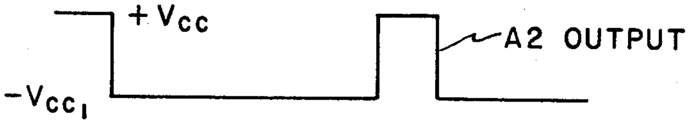

When noise (FIG. 6A) accompanies the input voltage (FIG. 6B) to A1 and the composite voltage (FIG. 6C) just barely equals the Reference Voltage, the noise may result in some input voltage half cycles being below the Reference Voltage (FIG. 6C). This situation will cause the output of amplifier A1 to miss a pulse (FIG. 6D). When a pulse from A1 is missing, C1 will discharge thru R3 to a voltage level below the Reference Voltage and A2 output will return to its initial state of +Vcc. Thus A2 output will appear with a pulse missing (FIG. 6E).

This type of A2 output may be called "double pulsing," since two pulses now occur where only one occurred before. Such "double pulsing" is adverse to logic and timing circuits which are driven by the Threshold Detector in such equipment as V.F. Receivers.

Figure 7A:
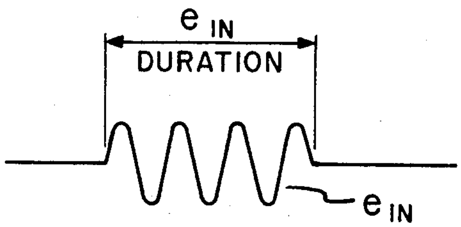
FIGS. 7A and 7B illustrate the error which results from attempts to correct the output of the threshold detector by increasing the storage time in the detector, and FIGS. 8A – 8C demonstrate the effect produced by feeding a part of the detector output voltage back to modify the reference voltage.
Figure 7B:
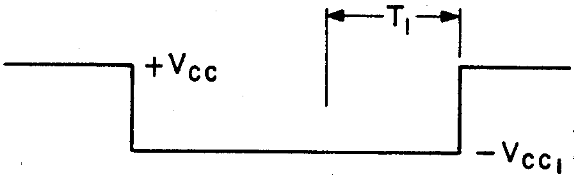

Of course, the R3C1 time constant could be extended to correct this effect of "double pulsing," but such action would result in expanding the effective duration of $e_{in}$ signal to amplifier A1. This is shown in FIGS. 7A and 7B where the increased duration of output from A2 is indicated at T1.

Such an extended A2 output is undesirable in equipment such as a V. F. Receiver in that such equipment requires that $e_{in}$ be present for a given period of time. This $e_{in}$ time duration requirement aids V. F. Receivers in having good music and speech immunity. Extending A2 output via the R3C1 time constant would cause $e_{in}$ durations not normally accepted to be accepted by a V. F. Receiver and thus reduce its music and speech immunity characteristics.

Figure 8A:
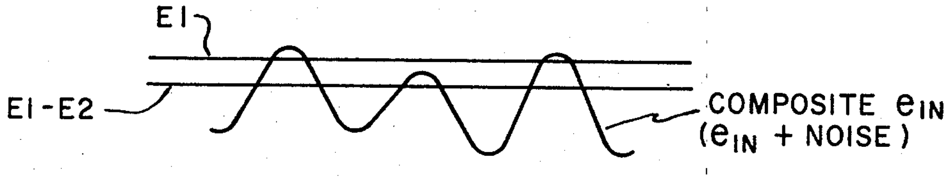
Figure 8B:
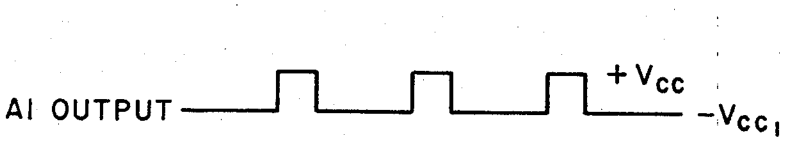
Figure 8C:
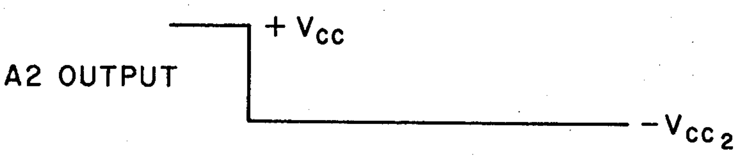

To overcome this problem without extending A2 output via the R3C1 time constant, feedback is employed. A portion of A2 output (E2) is fed back via resistor R5 to slightly reduce the reference Voltage level (E1). As a result, less $e_{in}$ voltage is required to initiate A1. These voltage relationships are indicated in FIGS. 8A, 8B and 8C. Note that no pulses are missing (FIG. 8B) and that there is no "double pulsing" of A2 output (FIG. 8C). Further note that the initial composite $e_{in}$ voltage level must be equal to the Reference Voltage before A2 output appears.

When point 8 (A2 output terminal) is at initial conditions (+Vcc), point 9 ($eo$) equals approximately +Vcc. When point 8 changes level to −Vcc1, point 9 is clamped to −Vcc2 (since −Vcc1 is more negative than −Vcc2). The clamping is accomplished via forward biasing of D2. At this time the voltage at point 9 corresponds to the −Vcc2 of FIG. 8C.

While the principles of the invention have been described above in connection with specific apparatus and applications, it is to be understood that this description is made only by way of example and not as a limitation on the scope of the invention.

I claim:

1. A threshold detector, responsive to a sinusoidal signal from a band pass filter to supply input for a voice frequency receiver comprising first comparator means coupled to compare voltages and provide an output voltage when a sinusoidal input voltage on a first terminal is equal to, or greater than, a reference voltage on a second terminal, storage means coupled to receive and store said output voltage, second comparator means coupled to the storage means and to the reference voltage on the second terminal for comparing the stored output voltage with said reference voltage and providing a second output voltage when the stored output voltage is equal to or exceeds the reference voltage, and means coupling said second output voltage to the second terminal to modify the reference voltage and prevent an erratic second output voltage due to noise associated with said sinusoidal input voltage.

2. In a threshold detector as claimed in claim 1 means for completing a connection to a band pass filter, means for assuring an accurate and stable reference voltage to enable preservation of desired bandwidth in a band pass filter, said means for assuring an accurate and stable reference voltage including a voltage divider formed of low tolerance metal film resistors from which the reference voltage is taken together with a high gain operational amplifier in the first comparator.

3. A threshold detector as claimed in claim 1, in which the reference voltage is held accurate and stable, to preserve the bandwidth of a band pass filter feeding said threshold detector, a high gain operational amplifier in said first comparator, and a voltage divider formed of low tolerance metal film resistors through which the reference voltage is supplied from a stable voltage source.

4. A threshold detector as claimed in claim 1, in which the first comparator means provides an output voltage in the form of a pulse, and the storage means includes an RC circuit responsive to said pulse to establish a voltage source for the second comparator means.

5. A threshold detector as claimed in claim 1, in which the output voltage produced by the first comparator means is a pulse at a voltage level above the reference voltage level, and the storage means includes an RC circuit responsive to said pulse to establish a voltage source for the second comparator means at a higher level than said reference voltage.

6. A threshold detector as claimed in claim 1, in which said first comparator provides a positive pulse, and unidirectional means are coupled to receive said positive pulse and transmit it to said storage means to provide a positive potential to said storage means.

7. A threshold detector as claimed in claim 1, in which said first comparator provides a positive pulse, said storage means responds to said positive pulse to provide a positive potential to said second comparator, and said second comparator responds to said positive potential to provide an output having a negative potential.

8. A threshold detector as claimed in claim 1, in which the first comparator means includes a first operational amplifier, the storage means includes an RC circuit, and the second comparator means includes a second operational amplifier.

9. A threshold detector as claimed in claim 1, in which the first comparator means provides an output voltage in the form of a positive pulse, the storage means includes an RC circuit responsive to said pulse to establish a voltage source for the second comparator means, and the second comparator means provides a constant output voltage while the voltage on said RC circuit is equal to or exceeds the reference voltage.

10. A threshold detector as claimed in claim 1, in which the first comparator provides an output voltage in the form of a pulse each time the sinusoidal input voltage rises to a level equal to, or greater than, the reference voltage, the storage means, in response to said pulses, maintains the stored voltage above a critical level for so long as the pulses continue and are separated by a particular time period, and the second comparator provides an output signal for so long as the stored voltage maintains a level equaling or exceeding the reference voltage.

11. A threshold detector as claimed in claim 1, in which the first comparator includes a first operational amplifier which provides an output voltage in the form of a pulse each time the sinusoidal input voltage exceeds the reference voltage, said operational amplifier supplies each pulse at an amplitude greater than the reference voltage, the storage means includes an RC circuit which responds to each pulse to renew the stored output voltage, and the second comparator includes a second operational amplifier responsive to provide an output voltage for so long as said stored output voltage exceeds said reference voltage.

12. A threshold detector as claimed in claim 1, in which the first terminal of the threshold detector is coupled to a band pass filter, and said first terminal of the comparator exhibits high input impedance to minimize loading effect on the filter.

13. A threshold detector as claimed in claim 1, in which said first and second comparators comprise operational amplifiers, and the reference voltage is provided from a stable voltage source over a voltage divider formed of low tolerance metal film resistors.

* * * * *